United States Patent
Bettencourt et al.

(10) Patent No.: US 10,277,176 B2
(45) Date of Patent: Apr. 30, 2019

(54) BIAS CIRCUITRY FOR DEPLETION MODE AMPLIFIERS

(71) Applicant: Raytheon Company, Waltham, MA (US)

(72) Inventors: John P. Bettencourt, Boxford, MA (US); Alan J. Bielunis, Hampstead, NH (US); Istvan Rodriguez, Chelsea, MA (US); Zhaoyang C. Wang, Carlisle, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/893,269

(22) Filed: Feb. 9, 2018

(65) Prior Publication Data

US 2018/0167041 A1    Jun. 14, 2018

Related U.S. Application Data

(63) Continuation of application No. 15/175,610, filed on Jun. 7, 2016, now Pat. No. 9,960,740.

(Continued)

(51) Int. Cl.
*H03F 3/04* (2006.01)
*H03F 3/195* (2006.01)
(Continued)

(52) U.S. Cl.
CPC .............. *H03F 3/195* (2013.01); *H03F 1/303* (2013.01); *H03F 3/193* (2013.01); *H03F 3/213* (2013.01);
(Continued)

(58) Field of Classification Search
CPC .......... H03F 3/195; H03F 1/303; H03F 3/193; H03F 3/213
(Continued)

(56) References Cited

U.S. PATENT DOCUMENTS 3,506,932 A    4/1970    Beurrier
4,743,862 A    5/1988    Scheinberg
(Continued)

FOREIGN PATENT DOCUMENTS

EP     2 816 729 A1    12/2014
WO    WO 97/23037      6/1997

OTHER PUBLICATIONS

PCT Notification of Transmittal of International Preliminary Report on Patentability (Chapter I of the Patent Cooperation Treaty), PCT/US2016/036546; dated Dec. 28, 2017, 1 page.
(Continued)

*Primary Examiner* — Khanh V Nguyen
*Assistant Examiner* — Khiem D Nguyen
(74) *Attorney, Agent, or Firm* — Daly, Crowley, Mofford & Durkee, LLP

(57) ABSTRACT

A circuit having an amplifier, comprising: a depletion mode transistor having a source electrode coupled to a reference potential; a drain electrode coupled to a potential more positive than the reference potential; and a gate electrode for coupling to an input signal. The circuit includes a bias circuit, comprising: a current source; and biasing circuitry coupled to the current source and between the potential more positive than the reference potential and a potential more negative than the reference potential. A control circuit is connected to the current source for controlling the amount of current produced by the current source to the biasing circuitry.

3 Claims, 4 Drawing Sheets

Related U.S. Application Data

(60) Provisional application No. 62/181,713, filed on Jun. 18, 2015.

(51) Int. Cl.
    *H03F 1/30*         (2006.01)
    *H03F 3/193*       (2006.01)
    *H03F 3/72*         (2006.01)
    *H03F 3/213*       (2006.01)

(52) U.S. Cl.
CPC .............. *H03F 3/72* (2013.01); *H03F 1/301* (2013.01); *H03F 2200/18* (2013.01); *H03F 2200/258* (2013.01); *H03F 2200/27* (2013.01); *H03F 2200/451* (2013.01); *H03F 2203/7203* (2013.01)

(58) Field of Classification Search
USPC .................................................. 330/296, 136
See application file for complete search history.

(56) References Cited

U.S. PATENT DOCUMENTS

| | | | |
|---|---|---|---|
| 4,896,121 A | 1/1990 | Larson | |
| 5,570,069 A | 10/1996 | Franke | |
| 5,892,400 A | 4/1999 | van Saders et al. | |
| 6,114,912 A * | 9/2000 | Ashby | H03F 3/04 327/530 |
| 6,600,301 B1 | 7/2003 | DeFalco | |
| 6,831,517 B1 | 12/2004 | Hedberg et al. | |
| 7,015,771 B2 | 3/2006 | Pelz | |
| 7,876,157 B1 * | 1/2011 | Kang | H03F 1/0261 330/285 |
| 7,928,804 B2 | 4/2011 | Yamamoto et al. | |
| 8,017,978 B2 | 9/2011 | Lidow et al. | |
| 8,854,140 B2 | 10/2014 | Bettencourt et al. | |
| 2010/0039168 A1 | 2/2010 | Bettencourt | |
| 2016/0373074 A1 | 12/2016 | Bettencourt et al. | |

OTHER PUBLICATIONS

PCT International Preliminary Report on Patentability, PCT/US2016/036646, dated Dec. 19, 2017, 1 page.

PCT Written Opinion of the ISA, PCT/US2016/036546; dated Dec. 28, 2017, 6 pages.

Fred Bonn, Bias Schemes for Enhancement and Depletion Mode GaAsFETS In Source-Follower Configuration, Motorola, Inc. Technical Developments, Mar. 1993, vol. 18, pp. 88-90, 3 pages.

Kazior, T.E. ; Chelakara, R. ; Hoke, W. ; Bettencourt, J. ; Palacios, T. ; Lee, H.S. "High Performance Mixed Signal and RF Circuits Enabled by the Direct Monolithic Heterogenous Integration of GaN HEMTs and Si CMOS on a Silicon Substrate", Compound Semiconductor Integrated Circuit Symposium (CSICS), 2011 IEEE DOI: 10.1109/CSICS.2011.6062443, pp. 1-4.

A. Gámez-Machado, D. Valdés-Martín, A. Asensio-López, J. Gismero-Menoyo, Microstrip-to-stripline planar transitions on LTCC, 2011, IEEE,4 pages.

C.Y. NG, M. Chongeheawchamnan, I.D. Robertson, Miniature Ka-Band I/Q Vector Modulator using 3D-MMIC Technology, $33^{rd}$ European Microwave Conference, Munich 2003, 4 pages.

Juno Kim, Hai-Young Lee, Tatsuo Itoh, Novel Microstrip-to-Stripline Transactions for Leakage Supression in Multilayer Microwave Circuits, 1998, IEEE, 4 pages.

Velijko Crnadak, Siniša Tasic, Improved VHF Quadrature Hybrid Coupler, 2016, IEEE, 4 pages.

PCT Notification of Transmittal of International Search Report and the Written Opinion of the International Searching Authority, or the Declaration, PCT/US2016/036546; dated Sep. 16, 2016, 1 page.

PCT International International Search Report, PCT/US2016/036546, dated Sep. 16, 2016, 6 pages.

PCT Written Opinion of the ISA, PCT/US2016/036546; dated Sep. 16, 2016, 7 pages.

* cited by examiner

BIAS CIRCUITRY FOR DEPLETION MODE AMPLIFIERS

CROSS REFERENCE TO RELATED APPLICATION

This application is a Continuation Application of U.S. patent application Ser. No. 15/175,610, filed on Jun. 7, 2016, which claims the benefit of U.S. Provisional Application No. 62/181,713, filed on Jun. 18, 2015, which applications are hereby incorporated herein by reference in their entirety.

TECHNICAL FIELD

This disclosure relates generally to bias circuitry and more particularly to bias circuitry for depletion mode amplifiers.

BACKGROUND

As is known in the art, RF power amplifiers using depletion mode transistors to amplify an input radio frequency signal often use solid state "drain" switches to turn on and off DC supply power.

An alternative to the drain switch is the gate switch, where a sufficiently negative voltage is supplied to the power amplifier's transistor gate to reduce the DC quiescent current to zero and also provide sufficient isolation in the RF path. An advantage of the gate switch approach is faster switching times between RF enable and off for systems using RF amplifiers. One such circuit (FIG. 1) is shown in U.S. Pat. No. 6,600,301 B1, issued Jul. 29, 2003, inventor DeFalco, assigned to the same assignee as the present invention. While such circuit has been found to be effective in many applications, in applications having a wide variation in temperature and power supply, a sufficient off-state voltage must be applied to it to establish proper quiescent bias for proper RF amplifier operation inclusive of process, temperature, and power supply variations.

As is also known in the art, wide bandgap transistors such as Gallium Nitride (GaN) High Electron Mobility Transistor (HEMT) and Silicon Carbide (SiC) Metal-Semiconductor Field Effect Transistor (MESFET) are great Radio Frequency (RF) power devices for their high voltage swings, high break voltages as well as the excellent thermal conductivity. Si Complimentary Silicon Oxide Semiconductor (CMOS) technologies offer tremendous levels of complexity and integration. Heterogeneous integration of both technologies can enable more features and capabilities of high performance microwave and mmWave systems. However, wide bandgap transistors operate in the range of tens (10s) to hundreds (100s) volts, and the supply voltage of submicron Si CMOS circuit is normally under 2.5V. Providing a low voltage CMOS bias control circuits to a high voltage GaN transistor is a challenge. Previously, the attempt had been made to control GaN HEMT bias with Si pMOS, which is operated in high voltage supply, 14 Volts as described in a paper by Kazior, T. E.; Chelakara, R.; Hoke, W.; Bettencourt, J.; Palacios, T.; Lee, H. S. entitled "High Performance Mixed Signal and RF Circuits Enabled by the Direct Monolithic Heterogeneous Integration of GaN HEMTs and Si CMOS on a Silicon Substrate", Compound Semiconductor Integrated Circuit Symposium (CSICS), 2011 IEEE DOI: 10.1109/CSICS.2011.6062443, Page(s): 1-4.

SUMMARY

In accordance with the disclosure, a circuit is provided, comprising: an amplifier, comprising: a depletion mode transistor having a source electrode coupled to a reference potential; a drain electrode coupled to a potential more positive than the reference potential; and a gate electrode for coupling to an input signal. The circuit includes a bias circuit, comprising: a current source; and biasing circuitry coupled to the current source and between the potential more positive than the reference potential and a potential more negative than the reference potential. A control circuit is connected to the current source for controlling the amount of current produced by the current source to the biasing circuitry.

In one embodiment, the control circuit comprises a switch fed by a control signal to selectively place the switch in either an "on "condition" to enable current from the current source to pass to the biasing circuitry producing a bias voltage at the gate electrode of the transistor, or, an "off condition electrically inhibit current from the current source to the biasing circuitry removing the bias voltage from the from the bias circuit removing the current source and the bias voltage at the gate electrode of the transistor.

In one embodiment, the control circuit varies the amount of current passing from the current source to the biasing circuitry in accordance with a control signal fed to the control circuit to corresponding vary a bias voltage at the gate electrode of the transistor.

In one embodiment, the control signal diverts current produced by the current source from the biasing circuit in accordance with the control signal.

Thus, by using this current diversion process rather that a current injection process, the control circuit is able to be implemented with relatively low voltage supplies and is able to control GaN bias with submicron Si CMOS operated in less than 2.5V.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
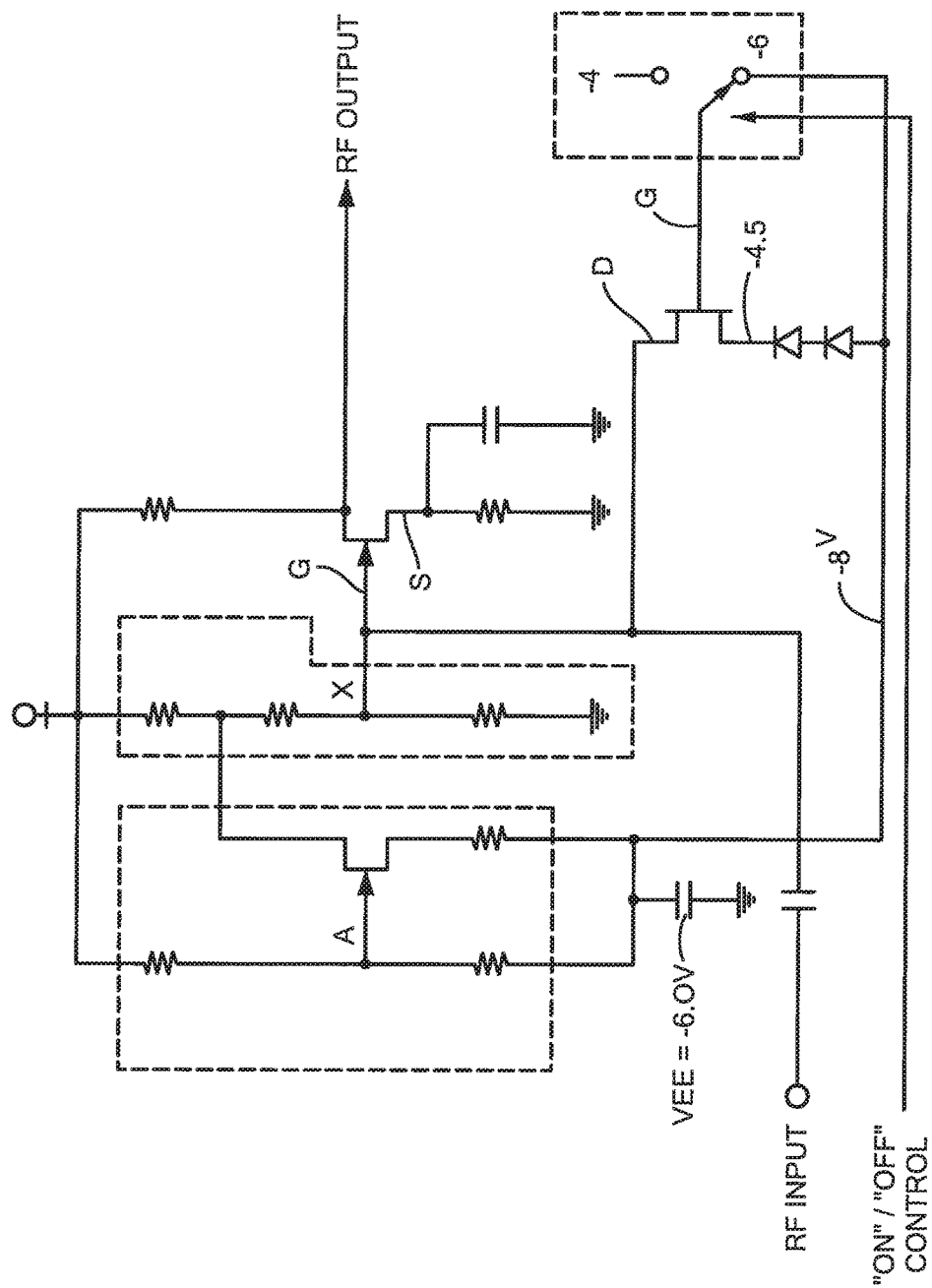
FIG. 1 is a circuit according to the PRIOR ART.
Figure 2:
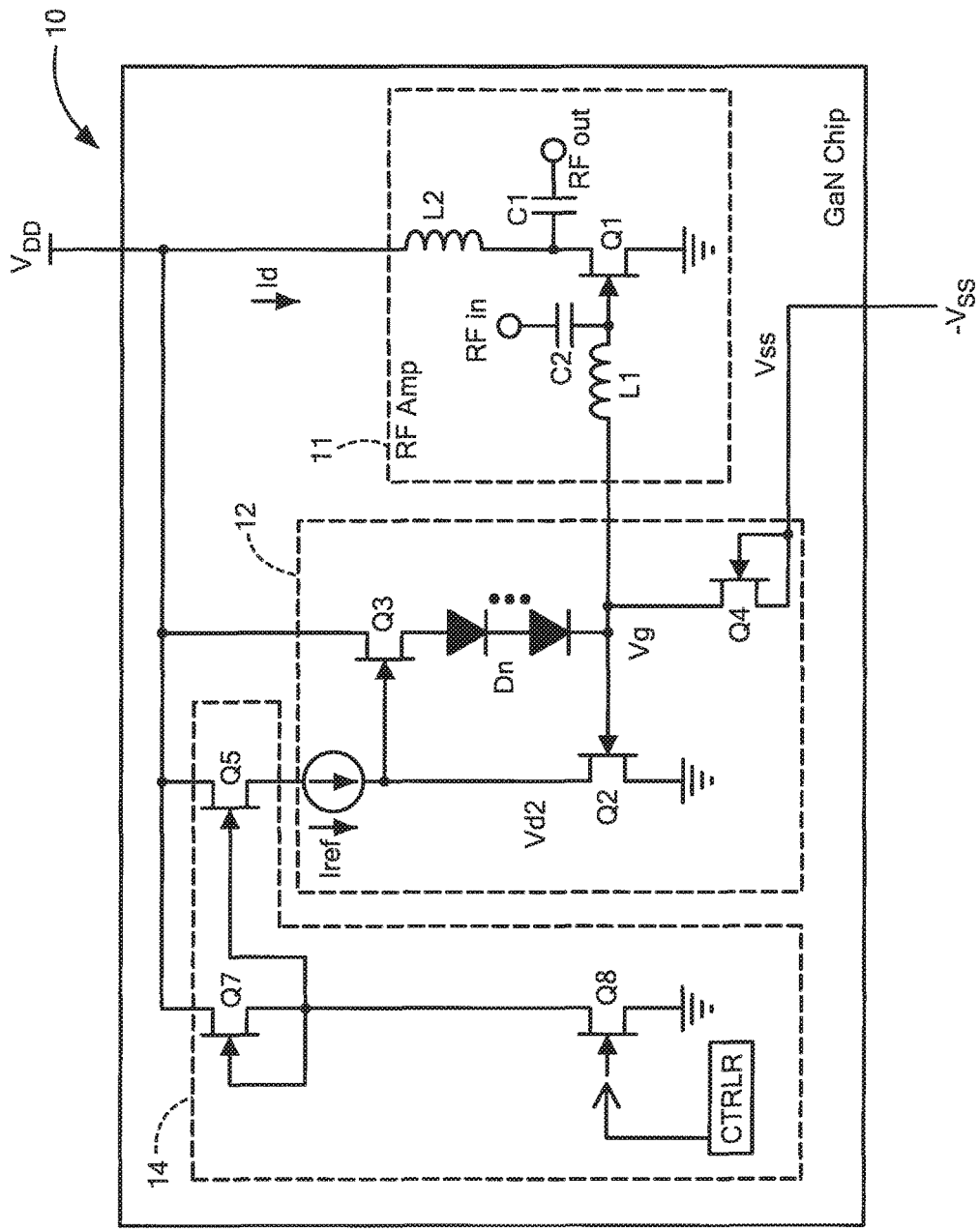
FIG. 2 is a circuit according to the disclosure.

Referring now to FIG. 2, a circuit 10 is shown having an amplifier 11, here a radio frequency (RF Amp), comprising: a depletion mode transistor Q1 having a source electrode coupled to a reference potential, here ground; a drain electrode coupled to a potential more positive than the reference potential, here (+Vdd) through an inductor L2, as shown, the drain electrode providing an amplified RF output after passing through a capacitor, C1, as shown; and a gate electrode for coupling to an input signal, here an RF input through a capacitor, C2, as shown. It is noted that the source electrode of the transistor Q1 is connected to ground, as shown.

The circuit 10 includes a bias circuit 12, comprising: a current mirror having: a current source $I_{ref}$, and biasing circuitry (depletion mode transistors Q2, Q3, and Q4 and diodes Dn) arranged as shown, coupled to the current source $I_{ref}$, and between the potential more positive than the reference potential (+Vdd) and a potential more negative than the reference potential; coupled to a potential more negative than the reference potential (−Vss). It should be noted that the diodes Dn is a series of a plurality n of diodes GaN diodes Dn, where n is the number of diodes in the series selected in accordance with the voltages used, here for example, Vdd is 24 volts and −Vss is −8.0 volts.

The circuit 10 includes a control circuit 14, here depletion mode transistors Q5, Q7 and Q8, connected between the potential more positive than the reference potential (+Vdd) and the current source, $I_{ref}$ for controlling the amount of current passing from the current source $I_{ref}$ to the biasing circuitry 12 (depletion mode transistors Q2, Q3 and Q4). Here, in FIG. 2, the control circuit 14, comprises a switch, here depletion mode transistors Q8, Q7, Q5 connected between the potential more positive than the reference potential (+Vdd) and the current source IT. The drain of transistor Q8 is connected to the gate of transistor Q7, the source of transistor Q7 and the gate of transistor Q5. A control signal, here either a logic 1, (here 0 volts) or a logic 0 (here −3.3 volts), is fed to the gate of transistor Q8, where the threshold voltage of Q8 is here −3.0 volts. In response to a logic 0 signal, transistor Q8 is placed in the "off" or non-conducting condition and therefore transistor Q5 in the "on" or conducting condition and thus switch 14 is in the "on" condition. Conversely, in response to a logic 1 fed to the gate of transistor Q8, transistor Q8 is placed in the "on" or conducting condition and transistor Q5 is in the "off" or non-conducting condition and thus switch 14 is in the "off" condition.

More particularly, when switch 14 is in the "on" condition, more particularly, when the gate of depletion mode transistor Q8 is in the "off "condition" in response to the logic 0 signal at its gate, transistor Q5 is in the "on" condition and thus switch 14 electrically connects the potential more positive than the reference potential (+Vdd) to the current source $I_{ref}$ so that current flows from the current source $I_{ref}$ to the biasing circuitry depletion mode transistors Q2, Q3 and Q4, producing a bias voltage at the gate electrode of the transistor Q1. On the hand, when switch 14 is in the "off" condition, more particularly, when the gate of depletion mode transistor Q8 is in the "on "condition" in response to the logic 1 signal at its gate, transistor Q5 is in the "off" condition and thus switch 14 electrically decouples the potential more positive than the reference potential (+Vdd) from the bias circuit 12 inhibiting or preventing current flow from the current source $I_{ref}$ to the biasing circuitry removing the current source Iref and hence the bias from the gate electrode of the transistor Q1.

The output of the bias circuit 12 is fed to the gate electrode of depletion mode transistor through an inductor L, as shown; it being noted that the deletion mode transistor Q4 is a diode connected transistor and couples the gate electrode of transistor Q1 to the potential more negative than the reference potential (−Vss), as shown.

Thus, the circuit is a D-mode current mirror circuit for quiescent bias control of GaN amplifiers where Q2 is a Gallium Nitride (GaN) mirror FET and Q1 is the GaN HEMT used in the RF amplifier. The reference current source Iref drawn in to Q2 controls the quiescent current Id of Q1. The current source $I_{ref}$ may be a saturated resistor as described in U.S. Pat. No. 8,854,140 or a linear resistor, transistor or from an off chip reference if needed.

Transistor Q5 is sized such that it stays in linear operation relative to Iref so that it accommodates the amount of current produced by the current source Iref. Thus, the circuit shown in FIG. 2 has the following features:
1. On/Off Bias control of depletion mode high power amplifiers.
2. Monolithic Integration of item #1 where the DC potential presented to the amplifier is less than ground potential.
3. All depletion mode transistor on/off control circuit for high power amplifiers Referring now to FIG. 3, a circuit 20 is shown here having as the control circuit 22 that varies the amount of current, Ictrl, is diverted from the current source Q10 (Is) to biasing circuitry 24 selectively in accordance with a control signal fed to the control circuit to corresponding vary a bias voltage at the gate electrode of the transistor, Q1. Here, FIG. 3 the control circuit 22 controls a GaN HEMT bias circuit 24 formed on a Group III-V chip, here a GaN chip, using submicron Silicon (Si) CMOS current Digital to Analog Converter (DAC) formed on a silicon chip. Thus, the circuit 24 on the right is in GaN HEMT technology, that is formed using a GaN chip. It is the similar D-mode current mirror circuit for Quiescent bias control of GaN RF amplifier 26. Depletion mode transistor Q10 provides a constant current source, Is. Depletion mode transistor Q2 is the GaN mirror FET and depletion mode transistor Q1 is the GaN HEMT used in the RF amplifier 24. The reference current Is drawn in to transistor Q2 and controls the quiescent current Id of transistor Q1. For the mirror circuit works properly, transistor Q2 needs to be in saturation mode. For a typical GaN HEMT, the drain voltage of transistor Q2, voltage Vd2 should be about 5V or higher. Vd2 is set by transistor Q3 and a series of a plurality n of diodes GaN diodes Dn, where n is the number of diodes in the series selected in accordance with the voltages used, here for example, Vdd is 24 volts and −Vss is −8.0 volts. The voltage drop across each of the n diodes Dn is set by current source of Q11 which, as will be shown, is controlled by a control signal CNTLR fed to a Digital to Analog Converter (DAC). The source of the control signal may be, for example, an analog signal related to the temperature of the GaN chip. Thus, the amount of current Ictrl passing though the diodes Dm, that is the amount of current bled from the current source Q10, Is, is a function of the control signal CNTLR fed to the DAC.

Figure 3:
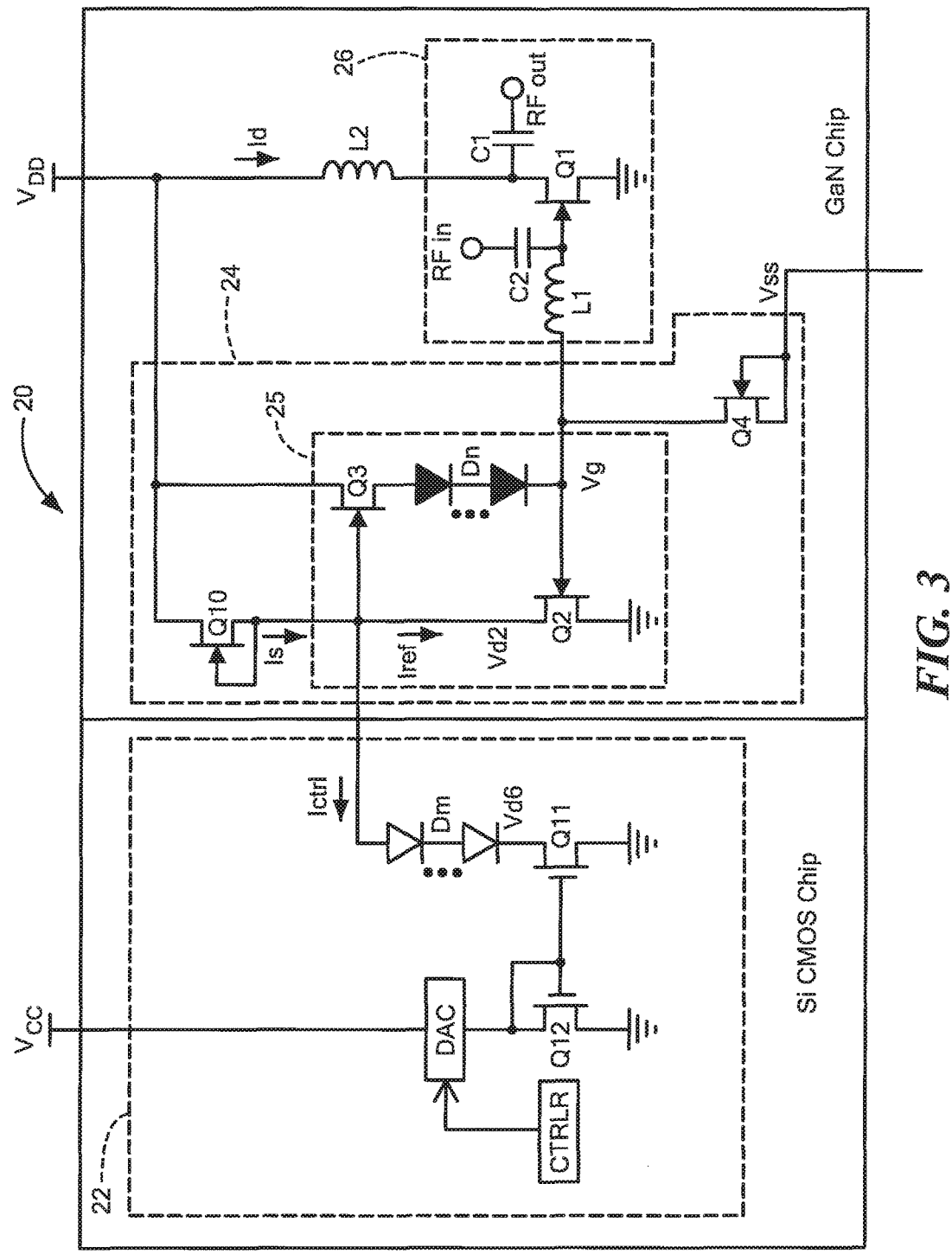
FIG. 3 is a circuit according to an alternative embodiment of the disclosure.

More particularly, the circuit 22 on the left in FIG. 3 is in a submicron Si CMOS technology that is formed on a silicon chip. The control current 22 controls the amount of current Ictrl bled or drawn from the current source Is. Thus, the control signal CTRLR diverts current Is produced by the current source, transistor Q10, from the biasing circuit in accordance with the control signal.

Assuming the gate current of transistor Q3 can be neglected in this analysis, the reference current is $$Iref=Is-Ictrl \qquad (1)$$

where Iref is the amount of current produced by the current source Q10 and fed to the biasing circuitry 25, here interconnected transistors Q2, Q3 and diodes Dn and Ictrl is the amount of current produced by the current source Q10 and diverted to the control circuit 22, more particularly diodes Dm and transistor Q11. Thus, by using this current diversion process rather that a current injection process, the control circuit 22 is able to be implemented with relatively low voltage supplies, Vcc.

In the CMOS control circuit 22, Ictrl is thus controlled by a standard current CMOS Digital to Analog Converter (DAC) coupled between Vcc and current mirror made up of diode connected NMOS transistor Q12 and NMOS transistor Q11, connected as shown. The CMOS circuit 22 is supplied by the standard CMOS supply voltage, Vcc, usually 2.5V or less. For deep submicron CMOS technology, the supply voltage can be 1.5V or lower. To keep the NMOS FET Q11 in a safe operational voltage range, a series of Si diodes Dm is used to connect the drain of NMOS FET Q11 to the drain of GaN HEMT Q2. The Si diodes Dm can be easily formed using NMOS FET or lateral PNP transistor offered in standard CMOS process. These diodes Dm lower the voltage of Vd2 (~>5V) to the safe drain voltage of Vd6, typically above 0.5V and less than 3V, depending on the CMOS technology used.

Figure 4:
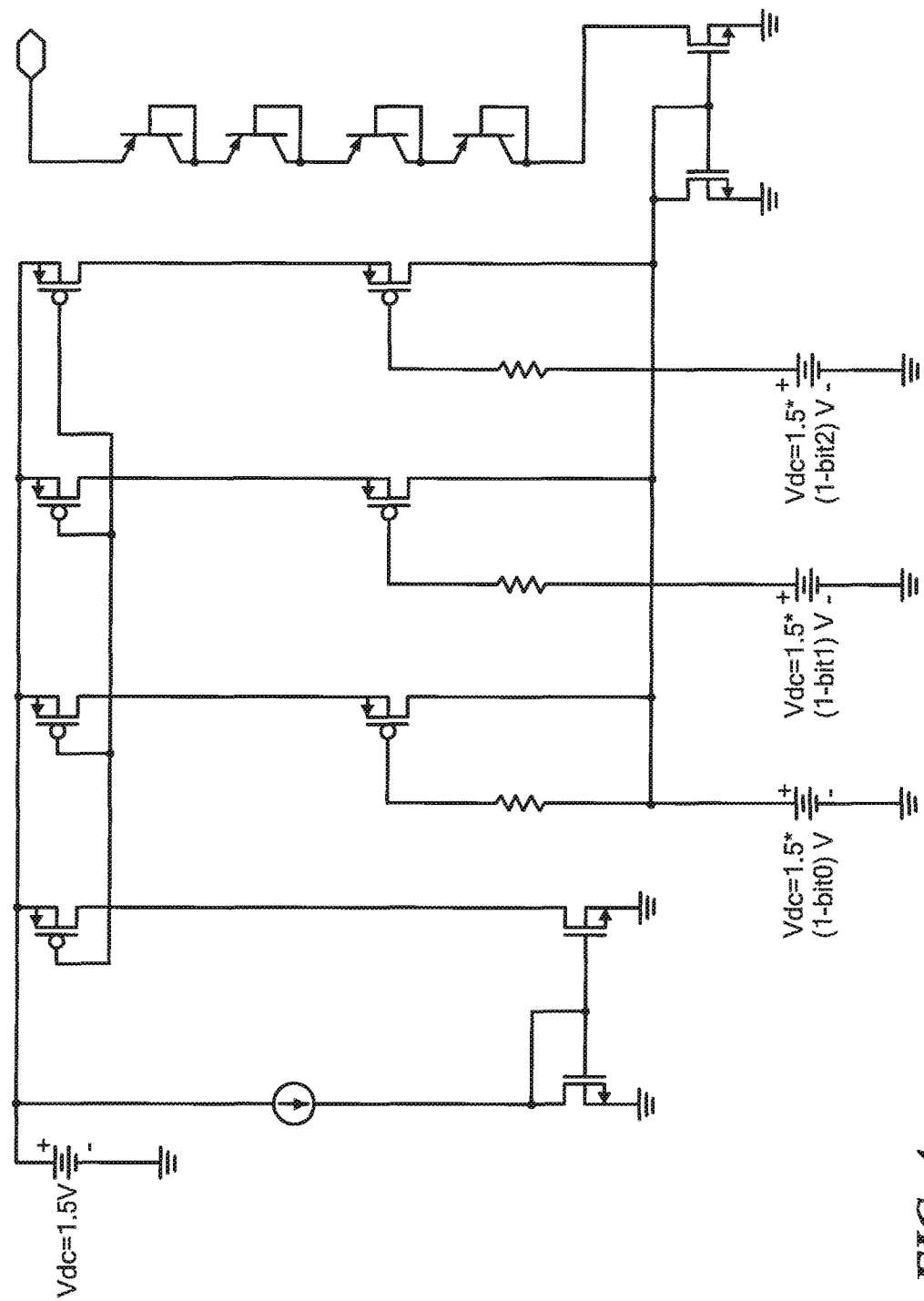
FIG. 4 shows the implementation of a control circuit used in the circuit of FIG. 3.

FIG. 4 shows the implementation of a control circuit on a 0.13 um Si CMOS process. The output current is controlled by a current DAC supplied by 1.5V. Here, lateral PNP or VPNP transistors are used to form Si diodes Dm to level shift the output voltage.

Thus, the circuit shown in FIG. 3 has the following features:
1. Controlling the bias of wide bandgap high voltage transistor (such as GaN or SiC HEMTs) with standard submicron Si CMOS circuit
2. To control the reference current in GaN bias, CMOS current DAC is used to drain current from GaN current source.
3. A series of Si diodes and a series of GaN diodes are used to set the safe and proper operation voltages for NMOS current sourcing FET and GaN HEMT mirror FET
4. Direct integration of the CMOS and GaN circuit without interface or adaptor circuitry
5. Heterogeneous integration of item 1, 2 and 3.

A number of embodiments of the disclosure have been described. Nevertheless, it will be understood that various modifications may be made without departing from the spirit and scope of the disclosure. Accordingly, other embodiments are within the scope of the following claims.

What is claimed is:
1. A circuit, comprising:
(A) an amplifier section comprising an output transistor, the output transistor having: a source electrode; a drain electrode; and a gate electrode;
(B) a bias circuit, comprising:
  (a) a current source;
  (b) biasing circuitry connected to a voltage source and connected between the current source and the gate electrode of the output transistor;
(C) a transistor switch having a pair of electrodes serially connected between the voltage source and the bias circuit for, while the biasing circuitry is connected to the voltage source either: (i) electrically coupling the voltage source to the current source; or (ii) electrically decoupling the voltage source from the current source, selectively in accordance with a control signal fed to a control electrode of the transistor switch; and
(D) wherein the bias circuit changes an amount of current passing through the drain electrode and the source electrode in accordance with whether: (i) the voltage source is electrically coupled to the current source or, (ii) the voltage source is electrically decoupled from the current source and;
(E) wherein:
  the biasing circuitry comprises:
    a biasing circuit transistor serially connected between the current source and a reference potential;
    a voltage level shifting circuit, serially connected between the voltage source and a potential more negative than the reference potential independent of the control signal fed to the transistor switch, for establishing a predetermined voltage at a gate electrode of the biasing circuit transistor; and
  wherein the gate electrode of the biasing circuit transistor is coupled to the gate of the output transistor.

2. The circuit recited in claim 1 wherein the current source and the source and drain of the biasing circuit transistor are serially coupled between the voltage source and the reference potential.

3. The circuit recited in claim 2 wherein the gate electrode of the output transistor is coupled to a potential more negative than the reference potential and the voltage source is at a potential more positive than the reference potential.

* * * * *